United States Patent
Nitawaki

(10) Patent No.: US 9,602,090 B2
(45) Date of Patent: Mar. 21, 2017

(54) SKEW ADJUSTMENT APPARATUS

(71) Applicant: LAPIS Semiconductor Co., Ltd., Yokohama (JP)

(72) Inventor: Shouji Nitawaki, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/080,438

(22) Filed: Mar. 24, 2016

(65) Prior Publication Data

US 2016/0285442 A1    Sep. 29, 2016

(30) Foreign Application Priority Data

Mar. 25, 2015  (JP) ................. 2015-062111

(51) Int. Cl.
| | |
|---|---|
| *H03K 5/133* | (2014.01) |
| *H03K 5/06* | (2006.01) |
| *H03L 7/00* | (2006.01) |
| *H03L 7/091* | (2006.01) |

(52) U.S. Cl.
CPC .............. *H03K 5/06* (2013.01); *H03L 7/00* (2013.01); *H03L 7/091* (2013.01)

(58) Field of Classification Search
USPC ........................................................ 327/158
See application file for complete search history.

(56) References Cited

U.S. PATENT DOCUMENTS

| | | | | |
|---|---|---|---|---|
| 9,319,035 B2* | 4/2016 | Canac | ...................... | H03K 5/06 |
| 2002/0060590 A1* | 5/2002 | Nitawaki | ............. | G09G 3/3685 |
| | | | | 327/112 |
| 2006/0242448 A1* | 10/2006 | Minzoni | .................. | H03K 5/06 |
| | | | | 713/503 |
| 2007/0097778 A1* | 5/2007 | LaBerge | ............. | G11C 7/1051 |
| | | | | 365/233.17 |

FOREIGN PATENT DOCUMENTS

JP        2001-274333 A    10/2001

* cited by examiner

*Primary Examiner* — Lincoln Donovan
*Assistant Examiner* — Patrick Chen
(74) *Attorney, Agent, or Firm* — Rabin & Berdo, P.C.

(57) ABSTRACT

First to N-th selection signals each instantaneously having a first logic level when representing selection and a second logic level when representing deselection are generated based on selection designation data. The first to N-th selection signals are individually latched, and first to N-th delayed selection signals are generated by individually delaying the first to N-th selection signals by a greater amount of delay when the latched selection signals transition from the first logic level to the second logic level than when the latched selection signals transition from the second logic level to the first logic level. A delayed data signal is selected corresponding to a delayed selection signal having the first logic level among the first to N-th delayed selection signals. The selected delayed data signal is output.

7 Claims, 13 Drawing Sheets

| B1 | B2 | d0 | d1 | d2 | d3 |
|----|----|----|----|----|----|
| 0  | 0  | 1  | 0  | 0  | 0  |
| 0  | 1  | 0  | 1  | 0  | 0  |
| 1  | 0  | 0  | 0  | 1  | 0  |
| 1  | 1  | 0  | 0  | 0  | 1  |

FIG.6

SKEW ADJUSTMENT APPARATUS

BACKGROUND OF THE INVENTION

1. Field of the Invention

The present invention relates to a skew adjustment apparatus which adjusts a skew of a clock signal in a clock synchronization circuit.

2. Description of the Related Art

As a skew adjustment circuit for adjusting a clock skew, a configuration that selects a delayed clock signal by using a selector from among delayed clock signals obtained by delaying an input clock signal by respective different amounts of delay and supplies the selected delayed clock signal to a clock terminal of a flip-flop has been proposed (for example, Japanese Patent Application Laid-Open No. 2001-274333). The amount of delay at which a specified setup time and hold time can be obtained with respect to a data signal is measured in advance. The skew adjustment circuit then adjusts the skew by selecting a delayed clock signal corresponding to the amount of delay by using the selector.

SUMMARY OF THE INVENTION

The foregoing skew adjustment circuit includes a decoder in its selector. When the delayed clock signals are switched, all the delayed clock signals can thus be instantaneously deselected to cause instantaneous signal omission.

Consequently, if a phase locked loop (PLL) circuit or a delay-locked loop (DLL) circuit is used to generate an internal clock signal that is synchronized in phase with the delayed clock signal output from the skew adjustment circuit, a loss of synchronization occurs in the PLL circuit or DLL circuit at the time of switching of the delayed clock signals. This produces a problem that an abnormal internal clock can be generated until the PLL circuit or DLL circuit returns to synchronization.

An object of the present invention is to provide a skew adjustment apparatus that can make a clock skew adjustment without causing signal omission in a normal operation.

A skew adjustment apparatus according to the present invention is a skew adjustment apparatus for adjusting a skew of a clock signal based on an original data signal on which the clock signal is superimposed, the skew adjustment apparatus including: a skew adjustment delay unit that generates first to N-th (N is an integer of 2 or more) delayed data signals being respectively delayed from said original data signal by N number of different amounts of delay; a decoder that generates first to N-th selection signals corresponding to the first to N-th delayed data signals and each instantaneously having a first logic level when it represents selection and a second logic level when it represents deselection, based on selection designation data applied thereto for designating selection of one of the first to N-th delayed data signals; first to N-th transition delay units that generate first to N-th delayed selection signals by individually latching and delaying the first to N-th selection signals; and a data selection unit that selects a delayed data signal corresponding to a delayed selection signal having the first logic level among the first to N-th delayed selection signals from among the first to N-th delayed data signals, and outputs the delayed data signal selected, the first to N-th transition delay units delaying the first to N-th selection signals by a greater amount of delay when the respective selection signals transition from the first logic level to the second logic level according to the selection designation data than when the respective selection signals transition from the second logic level to the first logic level.

According to the present invention, the first to N-th selection signals each instantaneously having the first logic level when representing "selection" and the second logic level when representing "deselection" are generated based on the selection designation data for selecting and designating one of the first to N-th delayed data signals obtained by delaying the original data signal by the respective different amounts of delay, the clock signal being superimposed on the original data signal. The first to N-th selection signals are individually latched, and the first to N-th delayed selection signals are generated by individually delaying the first to N-th selection signals by a greater amount of delay when the latched selection signals transition from the first logic level to the second logic level than when the latched selection signals transition from the second logic level to the first logic level. The data selection unit then selects and outputs a delayed data signal corresponding to a delayed selection signal having the first logic level among the first to N-th delayed selection signals from among the first to N-th delayed data signals.

According to such a configuration, even if all the first to N-th selection signals are instantaneously set to the second logic level representing "deselection" immediately after switching time when the content of the selection designation data is switched, at least one of the first to N-th delayed selection signals is maintained in the state of the first logic level representing "selection."

This prevents a situation where all the first to N-th delayed selection signals instantaneously have the second logic level representing "deselection" when the content of the selection designation data is switched for a clock skew adjustment. Omission of the output signal resulting from such a situation is thus prevented.

BRIEF DESCRIPTION OF THE DRAWINGS

FIG. 6 is a diagram showing a truth table of the decoder 320;

DETAILED DESCRIPTION OF THE INVENTION

Figure 1:
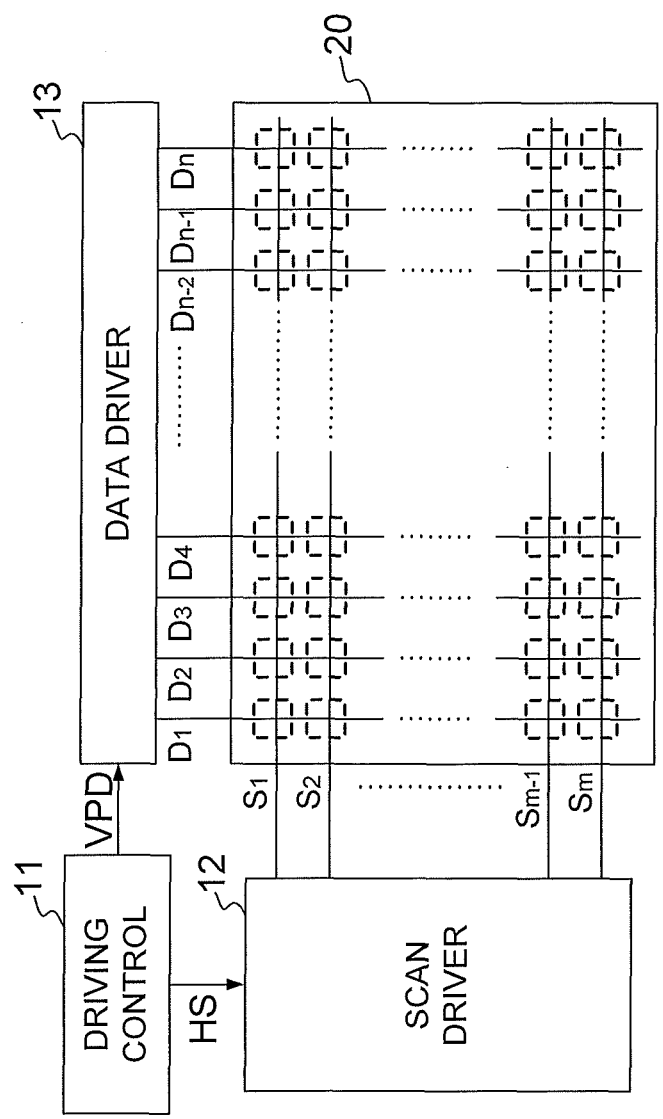
FIG. 1 is a block diagram showing a schematic configuration of a display apparatus including a skew adjustment apparatus according to the present invention.

FIG. 1 is a block diagram showing a schematic configuration of a display apparatus including a skew adjustment apparatus according to the present invention. As shown in FIG. 1, the display apparatus includes a driving control unit 11, a scan driver 12, a data driver 13, and a display device 20 including a liquid crystal panel or the like.

The display device 20 includes m (m is a natural number of 2 or more) horizontal scan lines $S_1$ to $S_m$ each extending in a horizontal direction of a two-dimensional screen, and n (n is a natural number of 2 or more) data lines $D_1$ to $D_n$ each extending in a vertical direction of the two-dimensional screen. Display cells serving as pixels are formed in the areas of respective intersections between the horizontal scan lines and the data lines.

The driving control unit 11 generates a series of pieces of pixel data PD based on an input video signal. For example, the pixel data PD expresses the luminance levels of the pixels in eight bits pixel by pixel. The driving control unit 11 generates a pixel data signal VPD by superimposing a reference timing signal on the series of pieces of pixel data PD, and supplies the pixel data signal VPD to the data driver 13, where the reference timing signal indicates reference timing of a clock signal. In other words, the driving control unit 11 supplies the pixel data signal VPD on which the clock signal is superimposed to the data driver 13. The driving control unit 11 further generates a horizontal scanning signal HS according to the input video signal, and supplies the horizontal scanning signal HS to the scan driver 12. The horizontal scanning signal HS indicates horizontal scan timing for the display device 20.

The scan driver 12 generates a horizontal scanning pulse having a predetermined peak voltage in synchronization with the horizontal scanning signal HS, and selectively applies the horizontal scanning pulse to each of the scan lines $S_1$ to $S_m$ of the display device 20 in order.

Figure 2:
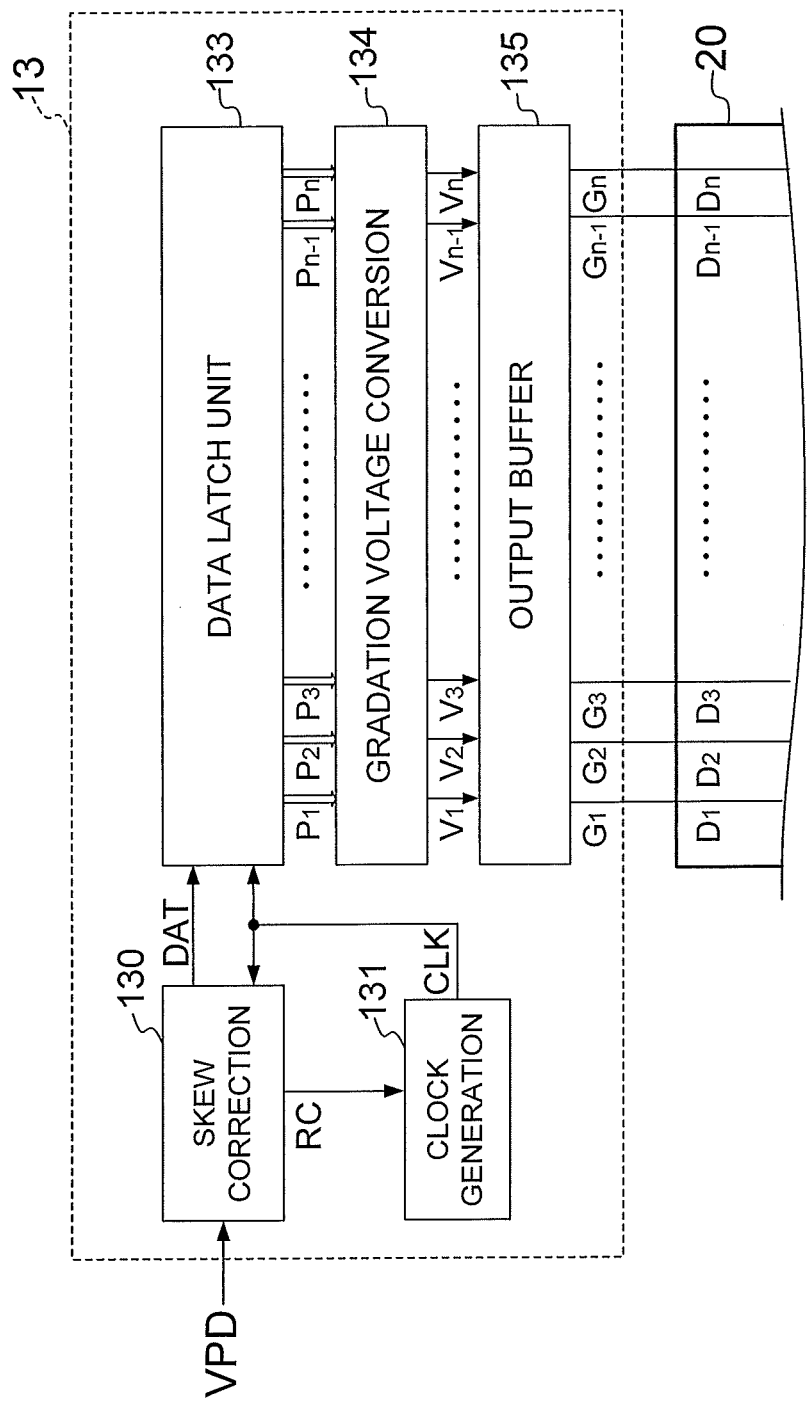
FIG. 2 is a block diagram showing an internal configuration of a data driver 13.

FIG. 2 is a block diagram showing an internal configuration of the data driver 13. The data driver 13 is formed on a semiconductor chip serving as a semiconductor device. The data driver 13 includes a skew correction unit 130, a clock generation unit 131, a data latch unit 133, a gradation voltage conversion unit 134, and an output buffer 135.

The skew correction unit 130 applies clock skew correction processing to the pixel data signal VPD, and supplies the resulting pixel data signal to the data latch unit 133 as a pixel data signal DAT. The skew correction unit 130 further applies clock skew correction processing to the pixel data signal VPD, and supplies the resulting pixel data signal to the clock generation unit 131 as a clock generation pixel data signal RC. The clock skew correction processing of the skew correction unit 130 will be described later.

The clock generation unit 131 includes a PLL circuit or DLL circuit, for example. The clock generation unit 131 generates an internal clock signal CLK which has a predetermined frequency and is synchronized in phase with the reference timing signal included in the clock generation pixel data signal RC. The clock generation unit 131 supplies the internal clock signal CLK to the skew correction unit 130 and the data latch unit 133.

The data latch unit 133 successively latches pixel data PD corresponding to respective pixels from the pixel data signal DAT at timing synchronized with the internal clock signal CLK. Each time the latching of pixel data PD as much as one horizontal scan line (n pieces) ends, the data latch unit 133 supplies the n pieces of pixel data PD to the gradation voltage conversion unit 134 as pixel data $P_1$ to $P_n$.

The gradation voltage conversion unit 134 converts the pixel data $P_1$ to $P_n$ into pixel driving voltages $V_1$ to $V_n$ having voltage values corresponding to the respective luminance levels, and supplies the pixel driving voltages $V_1$ to $V_n$ to the output buffer 135.

The output buffer 135 amplifies each of the pixel driving voltages $V_1$ to $V_n$ in a desired manner to generate pixel driving voltages $G_1$ to $G_n$. The output buffer 135 applies the pixel driving voltages $G_1$ to $G_n$ to the data lines $D_1$ to $D_n$ of the display device 20, respectively.

A configuration and operation of the skew correction unit 130 will be described below.

Figure 3:
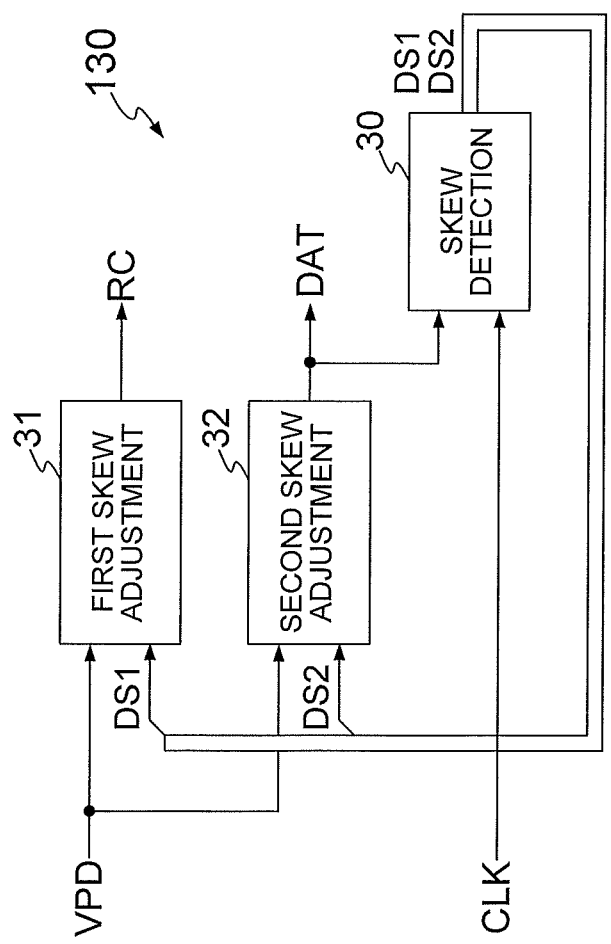
FIG. 3 is a block diagram showing an internal configuration of a skew correction unit 130.

FIG. 3 is a block diagram showing an internal configuration of the skew correction unit 130. As shown in FIG. 3, the skew correction unit 130 includes a skew detection circuit 30, a first skew adjustment circuit 31, and a second skew adjustment circuit 32.

The skew detection circuit 30 detects a phase difference between a rising or falling edge of the foregoing internal clock signal CLK and a rising or falling edge of the pixel data signal DAT as a value corresponding to a clock skew. The skew detection circuit 30 generates delay selection designation data DS1 which expresses the amount of delay corresponding to the phase difference, for example, in four levels by using two bits B1 and B2. The skew detection circuit 30 supplies the delay selection designation data DS1 to the first skew adjustment circuit 31. The skew detection circuit 30 further supplies delay selection designation data DS2 to the second skew adjustment circuit 32. The delay selection designation data DS2 expresses the amount of delay corresponding to a phase obtained by inverting the polarity of the phase difference, for example, in four levels by using two bits B1 and B2.

The first skew adjustment circuit 31 delays the pixel data signal VPD by the amount of delay designated by the delay selection designation data DS1. The first skew adjustment circuit 31 supplies the resulting signal to the foregoing clock generation circuit 131 as the clock generation pixel data signal RC of which a clock skew is adjusted. The second skew adjustment circuit 32 delays the pixel data signal VPD by the amount of delay designated by the delay selection designation data DS2. The second skew adjustment circuit 32 supplies the resulting signal to the foregoing data latch unit 133 as the pixel data signal DAT of which a clock skew is adjusted.

The first skew adjustment circuit 31 and the second skew adjustment circuit 32 have the same internal configuration.

Figure 4:
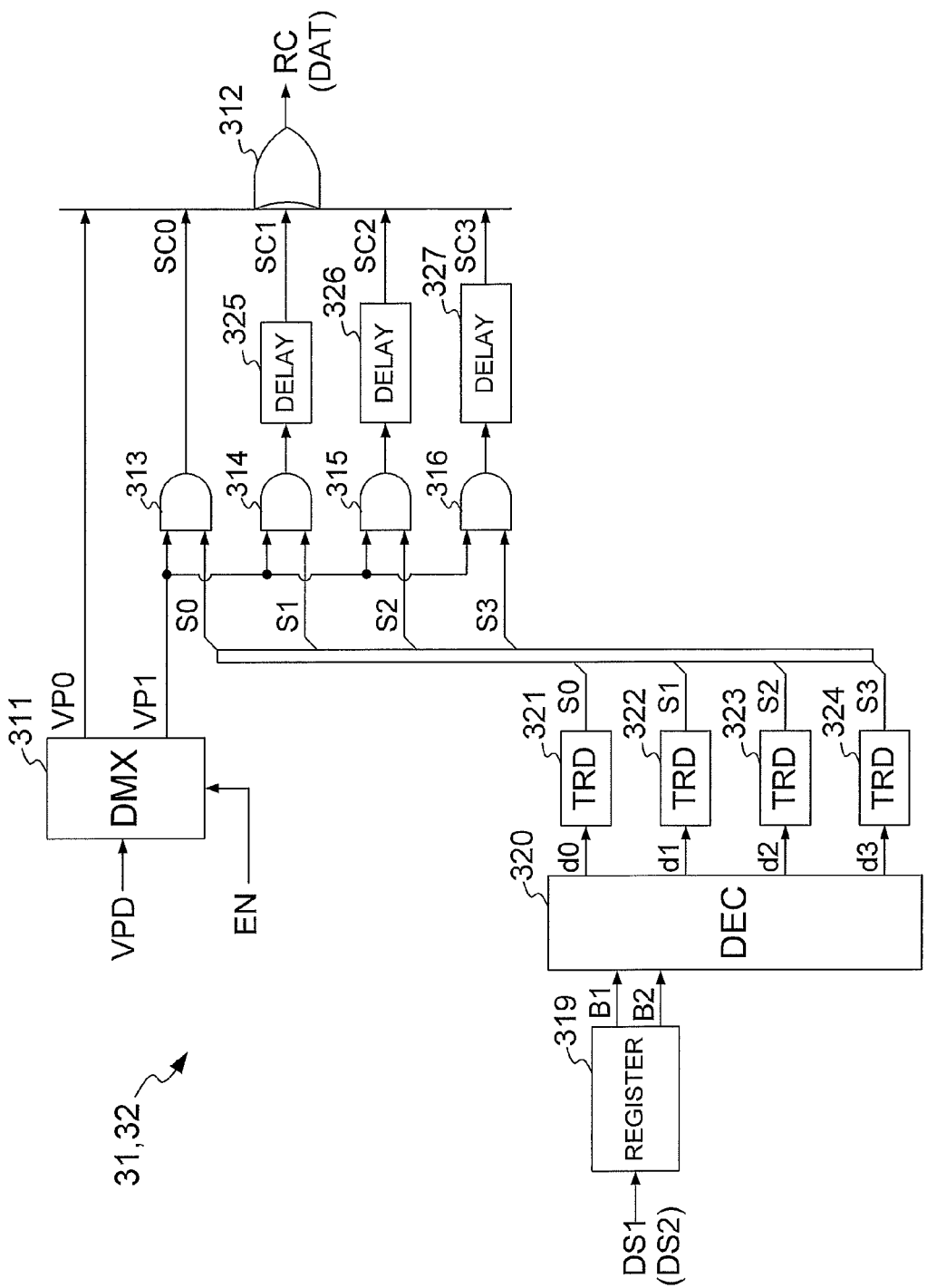
FIG. 4 is a circuit diagram showing an internal configuration of a first skew adjustment circuit 31 and a second skew adjustment circuit 32.

FIG. 4 is a circuit diagram showing an example of the internal configuration of each of the first skew adjustment circuit 31 and the second skew adjustment circuit 32. In FIG. 4, a register 319 latches and holds the delay selection designation data DS1 (DS2), and supplies the bits B1 and B2 of the delay selection designation data DS1 (DS2) to a decoder 320.

The decoder 320 generates four bits of selection signals d0 to d3 based on the bits B1 and B2.

Figure 5:
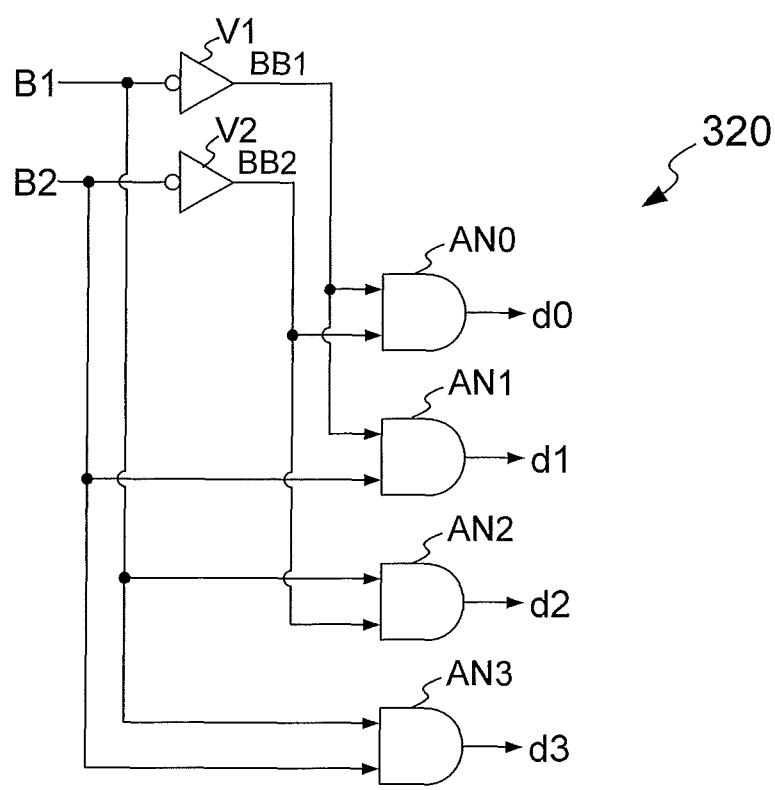
FIG. 5 is a circuit diagram showing an example of an internal configuration of a decoder 320.

FIG. 5 is a circuit diagram showing an example of an internal configuration of the decoder 320. As shown in FIG. 5, the decoder 320 includes inverters V1 and V2 and AND gates AN0 to AN3. The inverter V1 supplies an inverted bit BB1 obtained by inverting the logic level of the bit B1 to each of the AND gates AN0 and AN1. The inverter V2 supplies an inverted bit BB2 obtained by inverting the logic level of the bit B2 to each of the AND gates AN0 and AN2.

With such a configuration, the decoder 320 generates the 1-bit selection signals d0 to d3 corresponding to the bits B1 and B2 according to the truth table shown in FIG. 6.

Specifically, if the bits B1 and B2 both indicate the logic level 0, the decoder 320 obtains the selection signals d0 to d3 such that only the selection signal d0 has the logic level 1 which represents "selection," and all the other selection signals d1 to d3 have the logic level 0 which represents "deselection." If the bit B1 indicates the logic level 0 and the bit B2 indicates the logic level 1, the decoder 320 obtains the selection signals d0 to d3 such that only the selection signal d1 has the logic level 1 which represents "selection," and all the other selection signals d0, d2, and d3 have the logic level 0 which represents "deselection." If the bit B1 indicates the logic level 1 and the bit B2 indicates the logic level 0, the decoder 320 obtains the selection signals d0 to d3 such that only the selection signal d2 has the logic level 1 which represents "selection," and all the other selection signals d0, d1, and d3 have the logic level 0 which represents "deselection." If the bits B1 and B2 both indicate the logic level 1, the decoder 320 obtains the selection signals d0 to d3 such that only the selection signal d3 has the logic level 1 which represents "selection," and all the other selection signals d0 to d2 have the logic level 0 which represents "deselection." The decoder 320 supplies the selection signal d0 to a transition delay circuit 321, and supplies the selection signal d1 to a transition delay circuit 322. The decoder 320 further supplies the selection signal d2 to a transition delay circuit 323, and supplies the selection signal d3 to a transition delay circuit 324. Hereinafter, the transition delay circuits 321 to 324 will also be referred to as TRDs 321 to 324.

The TRDs 321 to 324 generate delayed selection signals S0 to S3 by latching and delaying the selection signals d0 to d3, respectively.

The TRDs 321 to 324 have the same internal configuration.

Figure 7:
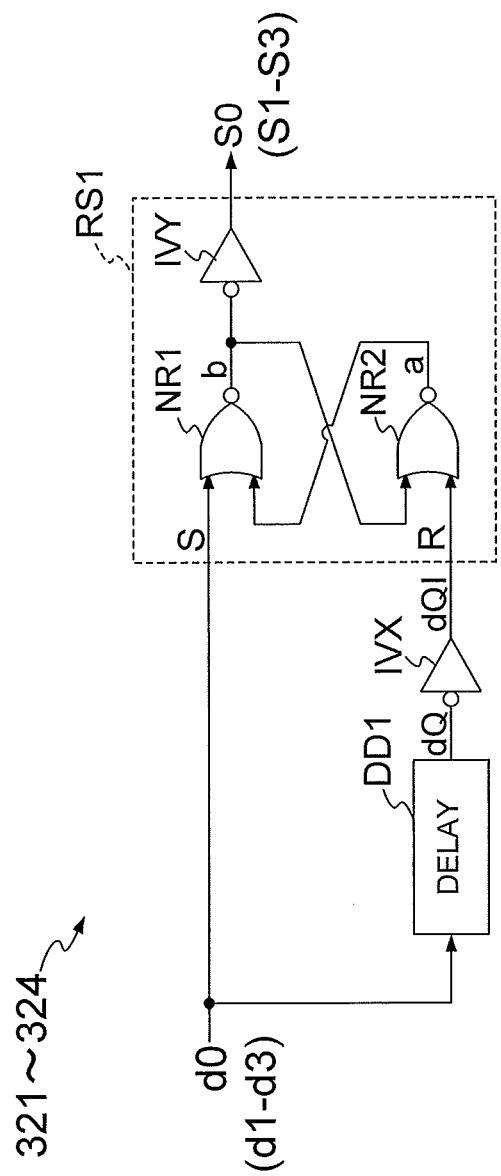
FIG. 7 is a circuit diagram showing an internal configuration of each of transition delay circuits 321 to 324.
Figure 8:
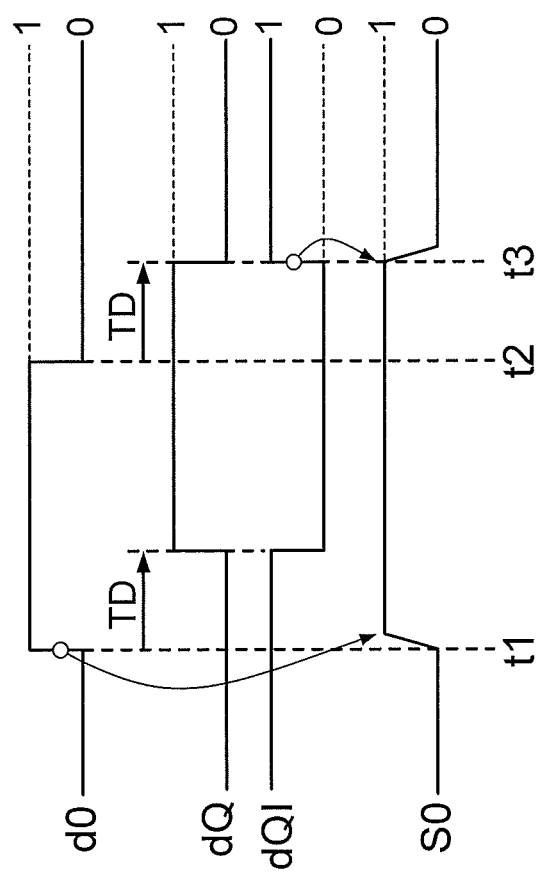
FIG. 8 is a timing chart showing an internal operation of each of the transition delay circuits 321 to 324.

FIG. 7 is a circuit diagram showing the internal configuration of each of the TRDs 321 to 324. The internal configuration will be described below by using the TRD 321 as an example. A delay element DD1 supplies a signal dQ obtained by delaying the selection signal d0 by a predetermined delay time TD as shown in FIG. 8 to an inverter IVX. The delay element DD1 may be implemented by an integration circuit including a capacitor and a resistor. The delay element DD1 may be implemented by an even number of inverter elements cascaded in series. The delay time TD is set in consideration of wiring delay as well as the delay of the integration circuit itself or the inverter elements themselves.

The inverter IVX supplies an inverted delayed selection signal dQI obtained by inverting the logic level of the signal dQ to the R terminal of an RS flip-flop RS1. The selection signal d0 is supplied to the S terminal of the RS flip-flop RS1.

As shown in FIG. 7, the RS flip-flop RS1 includes NOR gates NR1 and NR2 and an inverter IVY. A first input terminal of the NOR gate NR1 corresponds to the S terminal of the RS flip-flop RS1. A first input terminal of the NOR gate NR2 corresponds to the R terminal of the RS flip-flop RS1. The output terminal of the NOR gate NR1 is connected to the inverter IVY and a second input terminal of the NOR gate NR2. The output terminal of the NOR gate NR2 is connected to a second input terminal of the NOR gate NR1. The NOR gate NR1 supplies a signal "b" to the inverter IVY and the second input terminal of the NOR gate NR2. The signal "b" indicates the result of NOR between the selection signal d0 supplied via the S terminal and a signal "a" output from the NOR gate NR2. The NOR gate NR2 supplies the signal "a" to the second input terminal of the NOR gate NR1. The signal "a" indicates the result of NOR between the inverted delayed selection signal dQI supplied via the R terminal and the signal "b" output from the NOR gate NR1. The inverter IVY inverts the logic level of the signal "a" output from the NOR gate NR1, and outputs the resulting signal as the foregoing delayed selection signal S0.

With such a configuration, the TRD 321 generates the delayed selection signal S0. As shown in FIG. 8, the delayed selection signal S0 transitions from the state of the logic level 0 representing "deselection" to the state of the logic level 1 representing "selection" at time t1 of the rising edge of the selection signal d0. The delayed selection signal S0 transitions from the state of the logic level 1 to the state of the logic level 0 at time t3 after a lapse of the delay time TD from time t2 of the falling edge of the selection signal d0.

The TRD 321 latches and holds the selection signal d0 in the mode shown in FIG. 8, and supplies the held selection signal d0 to an AND gate 313 as the delayed selection signal S0. The TRDs 322 to 324 also individually latch and hold the respective selection signals d2 to d4 in the same mode as with the TRD 321, and supply the held selection signals d2 to d4 to AND gates 314 to 316 as the delayed selection signal S2 to S4, respectively.

In short, the TDRs 321 to 324 each delay the latched selection signal (d0 to d3) by a greater amount of delay when the selection signal (d0 to d3) transitions from the logic level 1 representing "selection" to the logic level 0 representing "deselection" than when the selection signal (d0 to d3) transitions from the logic level 0 to the logic level 1.

If an enable signal EN of the logic level 0 for disabling skew adjustment processing is supplied to a demultiplexer 311, the demultiplexer 311 supplies the pixel data signal VPD to an OR gate 312 as a pixel data signal VP0. This deactivates the AND gates 313 to 316 and delay circuits 325 to 327 to be described below, and makes power consumption reduced.

If the enable signal EN supplied to the demultiplexer 311 has the logic level 1 for enabling the skew adjustment processing, the demultiplexer 311 supplies the pixel data signal VPD to each of the AND gates 313 to 316 as a pixel data signal VP1. The enable signal EN is supplied from a controller (not shown) included in the data driver 13 or from the foregoing driving control unit 11.

The AND gate 313 supplies the pixel data signal VP1 to the OR gate 312 as a delayed pixel data signal SC0 having an amount of delay of 0 only if the delayed selection signal S0 has the logic level 1.

Figure 9:
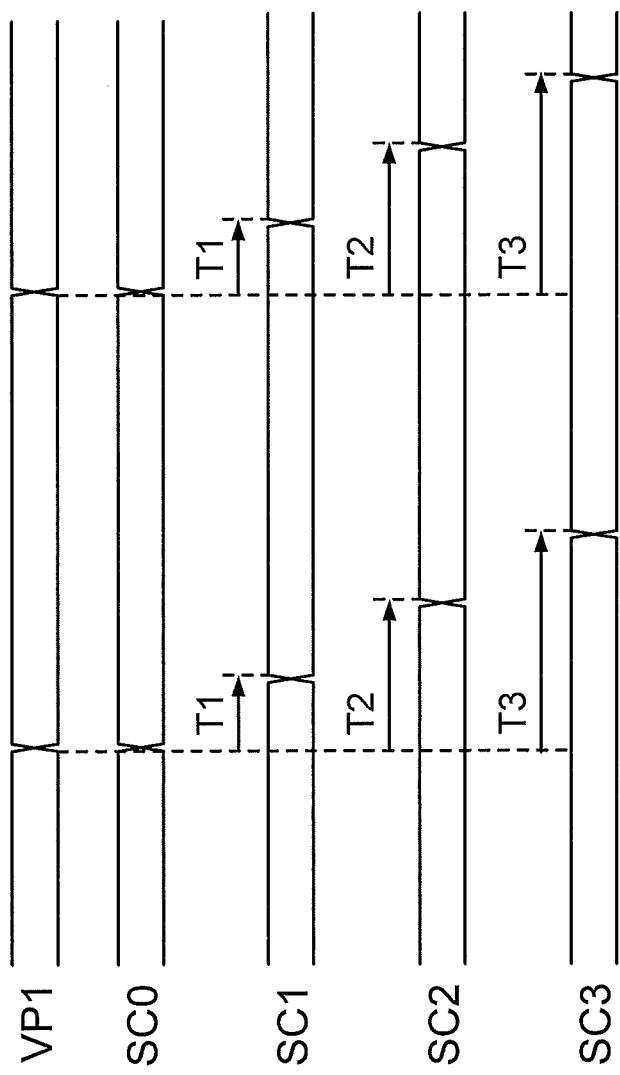
FIG. 9 is a timing chart showing a delay mode of each of delayed pixel data signals SC0 to SC3.

The AND gate 314 supplies the pixel data signal VP1 to the delay circuit 325 only if the delayed selection signal S1 has the logic level 1. The delay circuit 325 delays the pixel data signal VP1 supplied via the AND gate 314 by a predetermined delay time T1 as shown in FIG. 9, and supplies the resulting signal to the OR gate 312 as a delayed pixel data signal SC1.

The AND gate 315 supplies the pixel data signal VP1 to the delay circuit 326 only if the delayed selection signal S2 has the logic level 1. The delay circuit 326 delays the pixel data signal VP1 supplied via the AND gate 315 by a delay time T2 longer than the foregoing delay time T1 as shown in FIG. 9, and supplies the resulting signal to the OR gate 312 as a delayed pixel data signal SC2.

The AND gate 316 supplies the pixel data signal VP1 to the delay circuit 327 only if the delayed selection signal S3 has the logic level 1. The delay circuit 327 delays the pixel data signal VP1 supplied via the AND gate 316 by a delay time T3 longer than the foregoing delay time T2 as shown in FIG. 9, and supplies the resulting signal to the OR gate 312 as a delayed pixel data signal SC3.

As described above, a skew adjustment delay unit including the delay circuits 325 to 327 supplies the delayed pixel data signals SC0 to SC3 obtained by delaying the pixel data signal VP1 by the respective different amounts of delay (0, T1 to T3) to the OR gate 312.

For example, the delay circuits 325 to 327 each may include a plurality of inverter elements cascaded in series. In such a case, the number of inverter elements connected in series in the delay circuit 327 is greater than the number of inverter elements connected in series in the delay circuit 326.

The number of inverter elements connected in series in the delay circuit 326 is greater than the number of inverter elements connected in series in the delay circuit 325. The delay circuits 325 to 327 are adjusted by using wiring load capacitances between the respective AND gates 314 to 316 and the OR gate 312 so that the delay times of the delay circuits 325 to 327 coincide with the delay times T1 to T3 shown in FIG. 9, respectively. For example, to increase the delay time of each of the delay circuits 325 to 327, the length of the wiring that connects the inverter elements is increased.

The OR gate 312 outputs the result of OR between the foregoing pixel data signal VP0 and the delayed pixel data signals SC0 to SC3 as a signal of which a clock skew is adjusted. More specifically, the OR gate 312 included in the first skew adjustment circuit 31 shown in FIG. 3 outputs the pixel data signal VP0 or the delayed pixel data signal SC0, SC1, SC2, or SC3 as the clock generation pixel data signal RC of which a clock skew is adjusted. The OR gate 312 included in the second skew adjustment circuit 32 shown in FIG. 3 outputs the pixel data signal VP0 or the delayed pixel data signal SC0, SC1, SC2, or SC3 as the pixel data signal DAT of which a clock skew is adjusted.

In such a manner, a data selection unit including the AND gates 313 to 316 and the OR gate 312 selects a delayed pixel data signal corresponding to a delayed selection signal having the logic level 1 among the delayed selection signals S0 to S3 from among the delayed pixel data signals SC0 to SC3. The data selection unit then outputs the selected delayed pixel data signal as a signal of which a clock skew is adjusted (RC or DAT).

An example of an internal operation of the first skew adjustment circuit 31 shown in FIG. 4 will be described below with reference to the timing chart of FIG. 10.

Initially, if the enable signal EN of the logic level 1 for enabling the skew adjustment processing is supplied, the demultiplexer 311 supplies the pixel data signal VPD to each of the AND gates 313 to 316 as the pixel data signal VP1. As shown in FIG. 10, while the bits B1 and B2 of the delay selection designation data DS1 supplied from the skew detection circuit 30 shown in FIG. 3 are:
  B1: 0
  B2: 1,
the decoder 320 generates the selection signals d0 to d3:
  d0: 0
  d1: 1
  d2: 0
  d3: 0
according to the truth table of FIG. 6.

Figure 10:
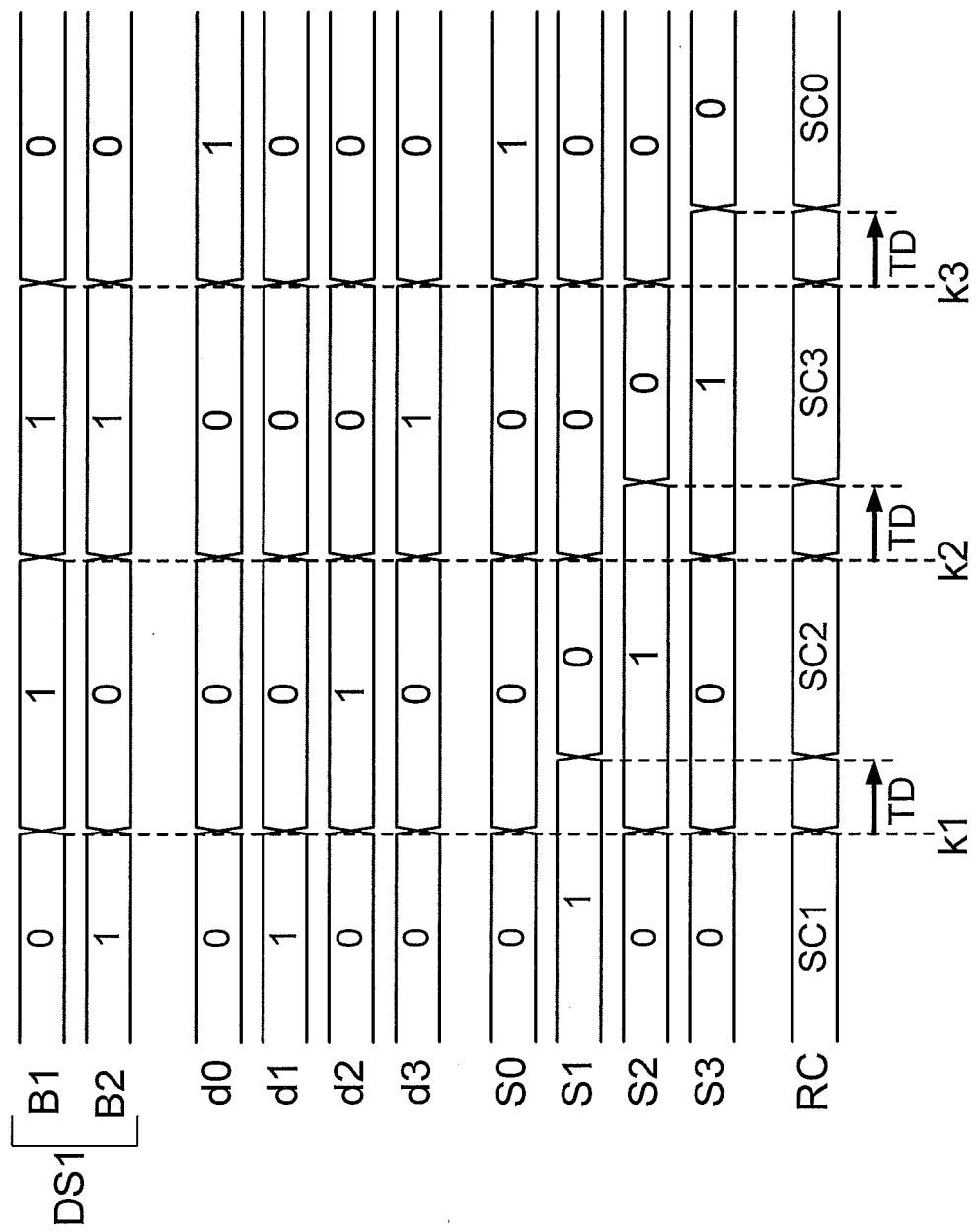
FIG. 10 is a timing chart showing an example of an internal operation of the first skew adjustment circuit 31.

The selection signals d0 to d3 are latched into the TRDs 321 to 324, respectively, and supplied to the AND gates 313 to 316 as the delayed selection signals S0 to S3 shown in FIG. 10, respectively.

Consequently, according to such delayed selection signals S0 to S3, only the delayed pixel data signal SC1 is enabled among the delayed pixel data signals SC0 to SC3 which have a delay mode such as shown in FIG. 9. The OR gate 312 thus outputs the delayed pixel data signal SC1 as the clock generation pixel data signal RC.

Now, as shown in FIG. 10, if the bits B1 and B2 of the delay selection and designation data DS1 are switched to:
  B1: 1
  B2: 0,
the decoder 320 generates the selection signals d0 to d3:
  d0: 0
  d1: 0
  d2: 1
  d3: 0
according to the truth table of FIG. 6.

The selection signals d0 to d3 are latched into the TRDs 321 to 324, respectively, and supplied to the AND gates 313 to 316 as the delayed selection signals S0 to S3 shown in FIG. 10, respectively.

If the bits B1 and B2 are switched from the state of [0,1] to the state of [1,0] as described above, only the selection signals d1 and d2 among the selection signals d0 to d3 change as follows: As shown in FIG. 10, the selection signal d1 transitions from the logic level 1 to the logic level 0. The selection signal d2 transitions from the logic level 0 to the logic level 1.

Here, in the TRD 323 which holds the selection signal d2, the selection signal d2 of the logic level 1 is supplied to the S terminal of the RS flip-flop RS1 shown in FIG. 7. In response to the selection signal d2 of the logic level 1 supplied to the S terminal, the RS flip-flop RS1 outputs the delayed selection signal S2 which transitions from the logic level 0 to the logic level 1 as shown in FIG. 10.

Meanwhile, in the TRD 322 which holds the selection signal d1, the inverted delayed selection signal dQI of the logic level 1, obtained by logically inverting the selection signal d1 of the logic level 0 via the delay element DD1 and the inverter IVX shown in FIG. 7, is supplied to the R terminal of the RS flip-flop RS1. Here, the delay element DD1 supplies the inverter IVX with the signal dQ which is delayed by the delay time TD from switching time k1 when, as shown in FIG. 10, the content of the delay selection designation data DS1, i.e., the bits B1 and B2 change from the state of [0,1] to the state of [1,0]. As shown in FIG. 10, the RS flip-flop RS1 thus makes the delayed selection signal S1 transition from the logic level 1 to the logic level 0 at the point in time when the delay time TD has elapsed from the foregoing switching time k1.

As a result, the delayed selection signal S1 of the logic level 1 is supplied to the AND gate 314 for the duration of the delay time TD from the foregoing switching time k1. Consequently, even if all the selection signals d0 to d3 instantaneously have the logic level 0 immediately after the switching time k1, the AND gate 314 continues being supplied with the selection signal d1 of the logic level 1 for the duration of the delay time TD. This prevents the situation where all the AND gates 313 to 316 are supplied with the selection signals (S0 to S3) of the logic level 0 immediately after the foregoing switching time k1. Signal omission of the clock generation pixel data signal RC resulting from such a situation is thus prevented.

According to the delayed selection signals S0 to S3 after a lapse of the delay time TD from the foregoing switching time k1, only the delayed pixel data signal SC2 is enabled among the delayed pixel data signals SC0 to SC3. The OR gate 312 then outputs the delayed pixel data signal SC2 as the clock generation pixel data signal RC.

Next, as shown in FIG. 10, if the bits B1 and B2 of the delay selection designation data DS1 are switched to:
  B1: 1
  B2: 1,
the decoder 320 generates the selection signals d0 to d3:
  d0: 0
  d1: 0
  d2: 0
  d3: 1
according to the truth table of FIG. 6.

The selection signals d0 to d3 are latched into the TRDs 321 to 324, respectively, and supplied to the AND gates 313 to 316 as the delayed selection signals S0 to S3 shown in FIG. 10, respectively.

If the bits B1 and B2 are switched from the state of [1,0] to the state of [1,1] as described above, only the selection signals d2 and d3 among the selection signals d0 to d3 change as follows: As shown in FIG. 10, the selection signal d2 transitions from the logic level 1 to the logic level 0. The selection signal d3 transitions from the logic level 0 to the logic level 1.

Here, in the TRD 324 which holds the selection signal d3, the selection signal d3 of the logic level 1 is supplied to the S terminal of the RS flip-flop RS1 shown in FIG. 7. In response to the selection signal d3 of the logic level 1 supplied to the S terminal, the RS flip-flop RS1 outputs the delayed selection signal S3 which transitions from the logic level 0 to the logic level 1 as shown in FIG. 10.

Meanwhile, in the TRD 323 which holds the selection signal d2, the inverted delayed selection signal dQI of the logic level 1, obtained by logically inverting the selection signal d2 of the logic level 0 via the delay element DD1 and the inverter IVX shown in FIG. 7, is supplied to the R terminal of the RS flip-flop RS1. Here, the delay element DD1 supplies the inverter IVX with the signal dQ which is delayed by the delay time TD from switching time k2 when, as shown in FIG. 10, the content of the delay selection designation data DS1, i.e., the bits B1 and B2 change from the state of [1,0] to the state of [1,1]. As shown in FIG. 10, the RS flip-flop RS1 thus makes the delayed selection signal S2 transition from the logic level 1 to the logic level 0 at the point in time when the delay time TD has elapsed from the foregoing switching time k2.

As a result, the delayed selection signal S2 of the logic level 1 is supplied to the AND gate 315 for the duration of the delay time TD from the foregoing switching time k2. Consequently, even if all the selection signals d0 to d3 instantaneously have the logic level 0 immediately after the switching time k2, the AND gate 315 continues being supplied with the selection signal d2 of the logic level 1 for the duration of the delay time TD. This prevents the situation where all the AND gates 313 to 316 are supplied with the selection signals (S0 to S3) of the logic level 0 immediately after the foregoing switching time k2. Signal omission of the clock generation pixel data signal RC resulting from such a situation is thus prevented.

According to the delayed selection signals S0 to S3 after a lapse of the delay time TD from the foregoing switching time k2, only the delayed pixel data signal SC3 is enabled among the delayed pixel data signals SC0 to SC3. The OR gate 312 then outputs the delayed pixel data signal SC3 as the clock generation pixel data signal RC.

Next, as shown in FIG. 10, if the bits B1 and B2 of the delay selection designation data DS1 are switched to:
  B1: 0
  B2: 0,
the decoder 320 generates the selection signals d0 to d3:
  d0: 1
  d1: 0
  d2: 0
  d3: 0
according to the truth table of FIG. 6.

The selection signals d0 to d3 are latched into the TRDs 321 to 324, respectively, and supplied to the AND gates 313 to 316 as the delayed selection signals S0 to S3 shown in FIG. 10, respectively.

If the bits B1 and B2 are switched from the state of [1,1] to the state of [0,0] as described above, only the selection signals d0 and d3 among the selection signals d0 to d3 change as follows: As shown in FIG. 10, the selection signal d0 transitions from the logic level 0 to the logic level 1. The selection signal d3 transitions from the logic level 1 to the logic level 0.

Here, in the TRD 321 which holds the selection signal d0, the selection signal d0 of the logic level 1 is supplied to the S terminal of the RS flip-flop RS1 shown in FIG. 7. In response to the selection signal d0 of the logic level 1 supplied to the S terminal, the RS flip-flop RS1 outputs the delayed selection signal S0 which transitions from the logic level 0 to the logic level 1 as shown in FIG. 10.

Meanwhile, in the TRD 324 which holds the selection signal d3, the inverted delayed selection signal dQI of the logic level 1, obtained by logically inverting the selection signal d3 of the logic level 0 via the delay element DD1 and the inverter IVX shown in FIG. 7, is supplied to the R terminal of the RS flip-flop RS1. Here, the delay element DD1 supplies the inverter IVX with the signal dQ which is delayed by the delay time TD from switching time k3 when, as shown in FIG. 10, the content of the delay selection designation data DS1, i.e., the bits B1 and B2 change from the state of [1,1] to the state of [0,0]. As shown in FIG. 10, the RS flip-flop RS1 thus makes the delayed selection signal S3 transition from the logic level 1 to the logic level 0 at the point in time when the delay time TD has elapsed from the foregoing switching time k3.

As a result, the delayed selection signal S3 of the logic level 1 is supplied to the AND gate 316 for the duration of the delay time TD from the foregoing switching time k3. Consequently, even if all the selection signals d0 to d3 instantaneously have the logic level 0 immediately after the switching time k3, the AND gate 316 continues being supplied with the selection signal d3 of the logic level 1 for the duration of the delay time TD. This prevents the situation where all the AND gates 313 to 316 are supplied with the selection signals (S0 to S3) of the logic level 0 immediately after the switching time k3. Signal omission of the clock generation pixel data signal RC resulting from such a situation is thus prevented.

According to the delayed selection signals S0 to S3 after a lapse of the delay time TD from the foregoing switching time k3, only the delayed pixel data signal SC0 is enabled among the delayed pixel data signals SC0 to SC3. The OR gate 312 then outputs the delayed pixel data signal SC0 as the clock generation pixel data signal RC.

According to the foregoing first skew adjustment circuit 31, signal omission occurring during selection switching processing when one of the delayed pixel data signals SC0 to SC3 is selected as the clock generation pixel data signal can be avoided. If a PLL circuit or the like is used to generate the internal clock signal synchronized in phase with the foregoing clock generation pixel data signal, a clock skew adjustment including the foregoing selection switching processing can thus be performed without causing a loss of synchronization in the PLL circuit.

Consequently, according to the first skew adjustment circuit 31, a clock skew adjustment can be made without causing an anomaly in the clock signal in a normal operation.

Figure 11:
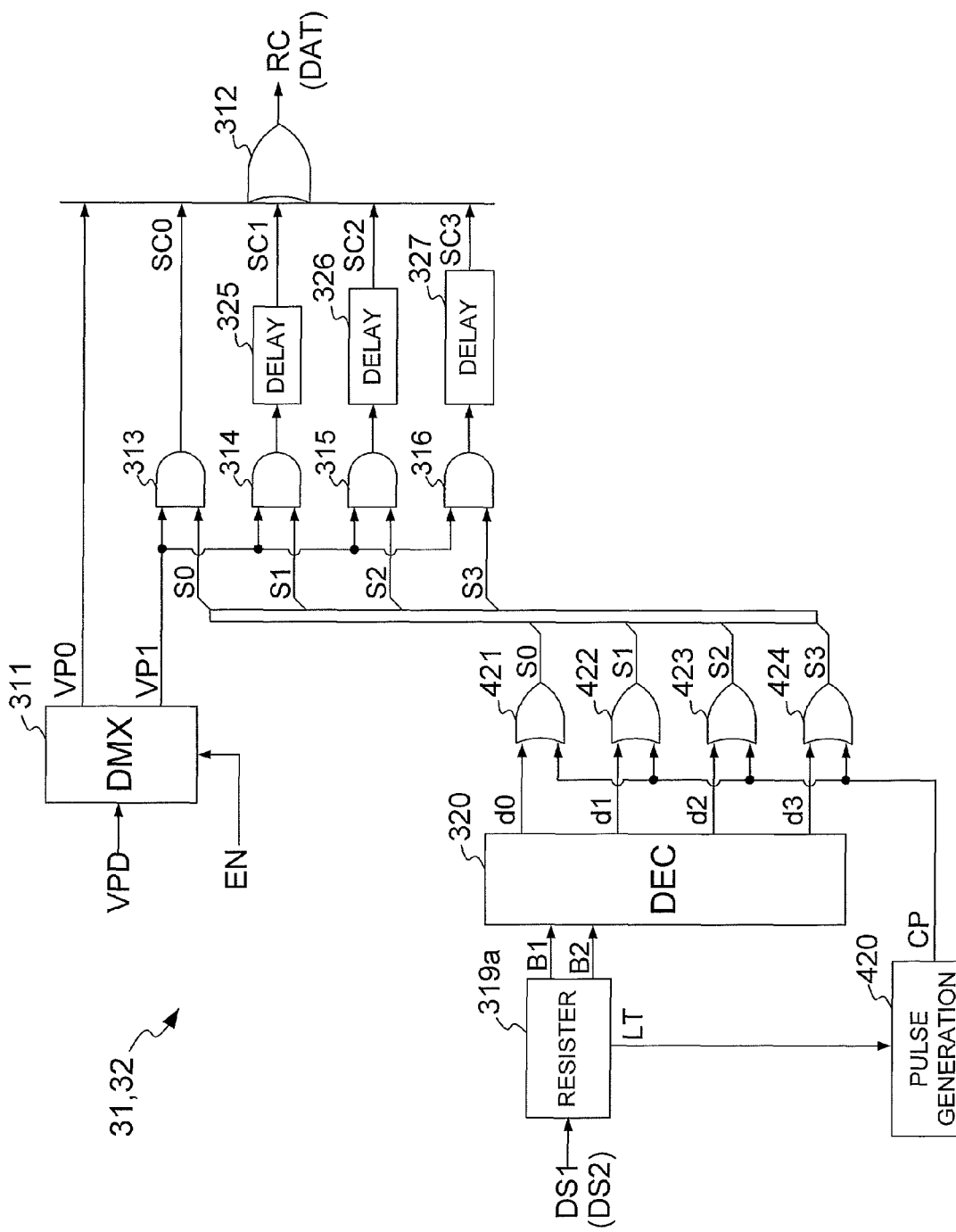
FIG. 11 is a circuit diagram showing a modification of the first skew adjustment circuit 31 and the second skew adjustment circuit 32.

FIG. 11 is a circuit diagram showing a modification of the first skew adjustment circuit 31 and the second skew adjustment circuit 32 shown in FIG. 4. The configuration shown in FIG. 11 is the same as that shown in FIG. 4 except that a register 319a is employed instead of the register 319, and a pulse generation circuit 420 and OR gates 421 to 424 are employed as transition delay circuits instead of the TRDs 321 to 324.

In FIG. 11, the register 319a latches and holds the delay selection designation data DS1 (DS2) supplied from the skew detection circuit 30, and supplies the bits B1 and B2 of the delay selection designation data DS1 (DS2) to the decoder 320.

Figure 12:
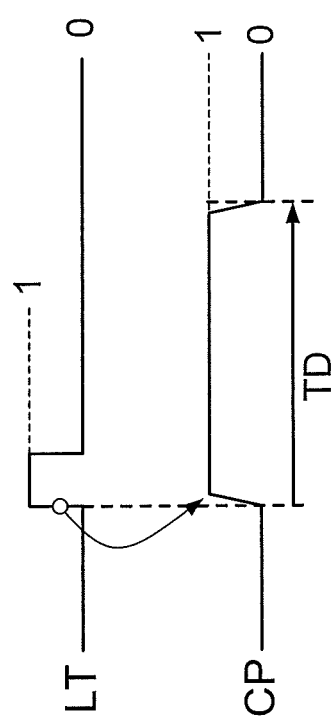
FIG. 12 is a timing chart showing an operation of a pulse generation circuit 420.

The register 319a further supplies a latch timing signal LT such as shown in FIG. 12 to the pulse generation circuit 420. Each time the delay selection designation data DS1 (DS2) is latched, the latch timing signal LT indicates the timing of latching.

As shown in FIG. 12, the pulse generation circuit 420 generates a pulse signal CP in synchronization with the rising edge of the latch timing signal LT. The pulse signal CP takes the state of the logic level 1 for the same period as the foregoing delay time TD.

The OR gate 421 performs logical OR operation of the logic level of the selection signal d0 and the logic level of the pulse signal CP, and supplies the result of the logical OR to the AND gate 313 as the delayed selection signal S0. The OR gate 422 performs logical OR operation of the logic level of the selection signal d1 and the logic level of the pulse signal CP, and supplies the result of the logical OR to the AND gate 314 as the delayed selection signal S1. The OR gate 423 performs logical OR operation of the logic level of the selection signal d2 and the logic level of the pulse signal CP, and supplies the result of the logical OR to the AND gate 315 as the delayed selection signal S2. The OR gate 424 performs logical OR operation of the logic level of the selection signal d3 and the logic level of the pulse signal CP, and supplies the result of the logical OR to the AND gate 316 as the delayed selection signal S3.

When forming the pulse generation circuit 420 and the OR gates 421 to 424 in a semiconductor chip, the pieces of wiring connecting the pulse generation circuit 420 with the respective OR gates 421 to 424 are desirably made to have the same lengths. The purpose is to make equal the times for the pulse signal CP output from the pulse generation signal 420 to reach the respective OR gates 421 to 424.

Figure 13:
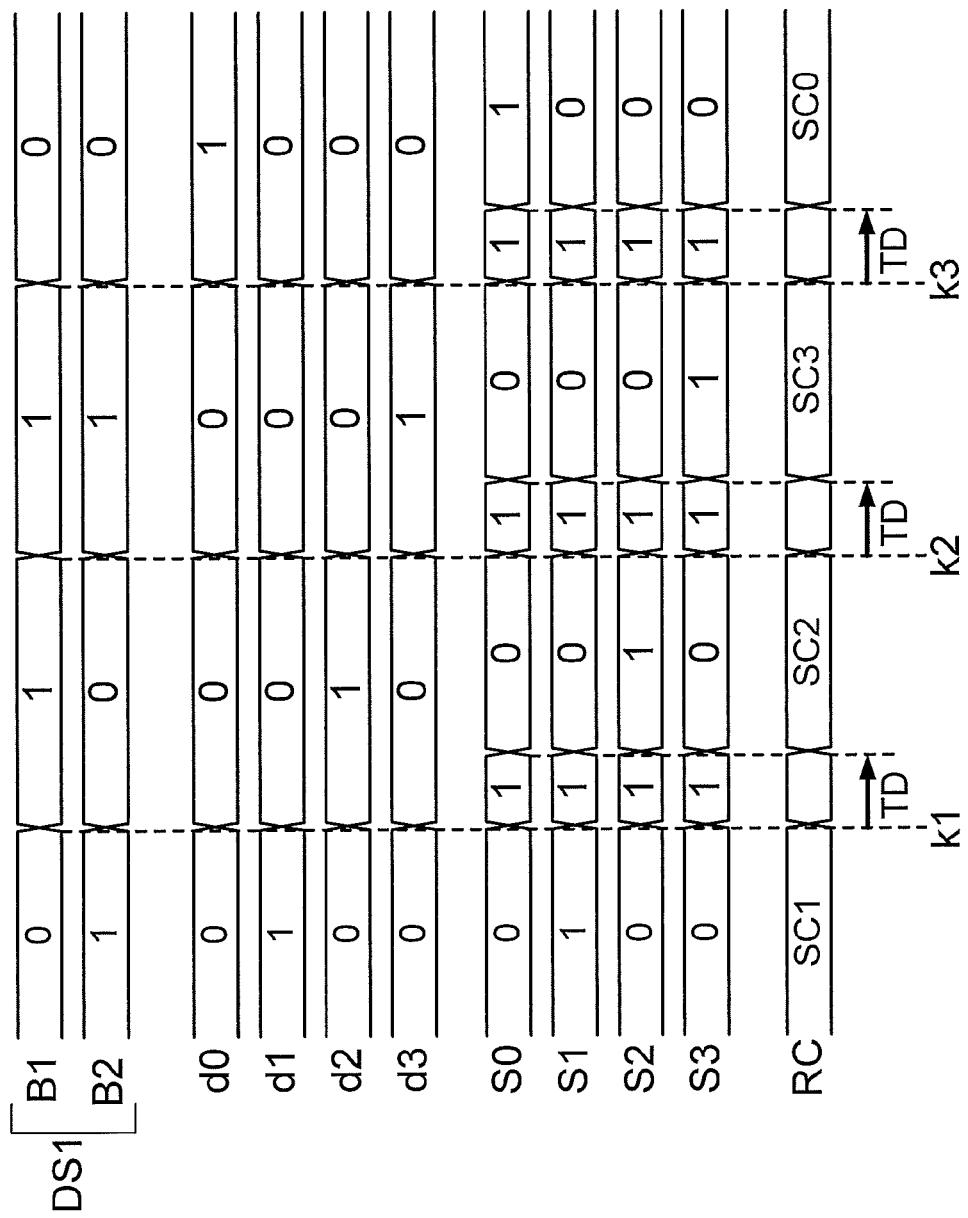
FIG. 13 is a timing chart showing an example of an internal operation of the first skew adjustment circuit 31 shown in FIG. 11.

According to the pulse generation circuit 420 and the OR gates 421 to 424 described above, as shown in FIG. 13, all the delayed selection signals S0 to S3 are forcibly turned to the logic level 1 during the periods from the respective switching times k1, k2, and k3 when the content (B1 and B2) of the delay selection designation data DS1 is switched to when a predetermined delay time TD elapses.

Even if all the selection signals d0 to d3 instantaneously have the logic level 0 immediately after each switch time (k1 to k3), the selection signals d0 to d3 of the logic level 1 are therefore forcibly supplied to the respective AND gates 313 to 316 for the duration of the delay time TD. This prevents the situation where all the AND gates 313 to 316 are instantaneously supplied with the selection signals (S0 to S3) of the logic level 0 immediately after the switching time. Signal omission of the clock generation pixel data signal RC resulting from such a situation is thus prevented.

Consequently, if the configuration shown in FIG. 11 is employed, as with the case where the configuration shown in FIG. 4 is employed, a clock skew adjustment can be made without causing an anomaly in the clock signal in a normal operation.

In the foregoing embodiment, the selection signals (d0 to d3) have the logic level 1 when representing "selection," and the logic level 0 when representing "deselection." However, "selection" may be represented by the logic level 0 and "deselection" by the logic level 1. In such a case, the input terminals with which the two-input AND gates 313 to 316 receive the respective delayed selection signals S0 to S3 are configured to be inverting input terminals each including an inverter.

In the embodiment shown in FIGS. 4 and 11, one of the four delayed pixel data signals SC0 to SC3 having respective different amounts of delay is selected, and the selected delayed pixel data signal is output as the skew-adjusted pixel data signal (RC or DAT). However, the number of delayed pixel data signals to be selected is not limited to four. More specifically, the number of delayed pixel data signals to be selected may be N (N is an integer of 2 or more). In such a case, the first skew adjustment circuit 31 and the second skew adjustment circuit 32 include N TRDs and N two-input AND gates corresponding to the respective delayed pixel data signals to be selected.

In other words, the first skew adjustment circuit 31 and the second skew adjustment circuit 32 may each include the following skew adjustment delay unit (325 to 327), decoder (320), first to N-th transition delay units (321 to 324), and data selection unit (312 to 316). The skew adjustment delay unit generates first to N-th (N is an integer of 2 or more) delayed data signals obtained by delaying the original data signal on which the clock signal is superimposed by respective different amounts of delay. Based on the selection designation data (DS1 or DS2) for designating selection of one of the first to N-th delayed data signals, the decoder generates first to N-th 1-bit selection signals corresponding to the first to N-th delayed data signals, respectively, the first to N-th selection signals each instantaneously having a first logic level when representing selection and a second logic level when representing deselection. The first to N-th transition delay units generate first to N-th delayed selection signals by individually latching and delaying the first to N-th selection signals. Here, the first to N-th transition delay units individually delay the respective first to N-th selection signals by a greater amount of delay when the respective selection signals transition from the first logic level to the second logic level according to the selection designation data than when the respective selection signals transition from the second logic level to the first logic level. The data selection unit selects a delayed data signal corresponding to a delayed selection signal having the first logic level among the first to N-th delayed selection signals from among the first to N-th delayed data signals, and outputs the delayed data signal selected.

What is claimed is:
1. A skew adjustment apparatus for adjusting a skew of a clock signal based on an original data signal on which the clock signal is superimposed, the skew adjustment apparatus comprising:

a skew adjustment delay unit that generates first to N-th (N is an integer of 2 or more) delayed data signals being respectively delayed from said original data signal by N number of different amounts of delay;

a decoder that generates first to N-th selection signals corresponding to the first to N-th delayed data signals and each instantaneously having a first logic level when it represents selection and a second logic level when it represents deselection, based on selection designation data applied thereto for designating selection of one of the first to N-th delayed data signals;

first to N-th transition delay units that generate first to N-th delayed selection signals by individually latching and delaying the first to N-th selection signals; and a data selection unit that selects a delayed data signal corresponding to a delayed selection signal having the first logic level among the first to N-th delayed selection signals from among the first to N-th delayed data signals, and outputs the delayed data signal selected, wherein the first to N-th transition delay units delaying the first to N-th selection signals by a greater amount of delay when the respective selection signals transition from the first logic level to the second logic level according to the selection designation data than when the respective selection signals transition from the second logic level to the first logic level.

2. The skew adjustment apparatus according to claim 1, wherein:

the first to N-th transition delay units each include an inversion delay unit that generates an inverted delayed selection signal by delaying a signal having an inverted logic level of the latched selection signal for a predetermined period, and an RS flip-flop that comprises an S terminal and an R terminal, and receives the latched selection signal with the S terminal and the inverted delayed selection signal with the R terminal; and generates signals output from the RS flip-flops of the respective first to N-th transition delay units as the first to N-th delayed selection signals.

3. The skew adjustment apparatus according to claim 1, comprising:

a register that latches and holds the selection designation data; and a pulse generation unit that generates a pulse signal, the pulse signal being in a state of the first logic level for a predetermined period each time the register latches the selection designation data, the pulse signal being in a state of the second logic level in a period other than the predetermined period, wherein the first to N-th transition delay units include respective first to N-th OR gates that each generate a result of a logical OR between the latched selection signal and the pulse signal as the first to N-th delayed selection signals.

4. The skew adjustment apparatus according to claim 3, wherein pieces of wiring connecting the pulse generation unit with the respective first to N-th OR gates to transmit the pulse signal have the same lengths.

5. The skew adjustment apparatus according to claim 1, wherein:

the data selection unit includes first to N-th two-input AND gates and an output OR gate, the first to N-th delayed selection signals being supplied to first input terminals of the respective first to N-th two-input AND gates, the original data signal being supplied to second input terminals of the respective first to N-th two-input AND gates;

the skew adjustment delay unit generates the first to N-th delayed data signals by delaying outputs of the first to N-th two-input AND gates by respective different amounts of delay; and the output OR gate outputs a result of a logical OR of the first to N-th delayed data signals as the delayed data signal selected.

6. The skew adjustment apparatus according to claim 5, comprising a demultiplexer that stops supplying the original data signal to the first to N-th two-input AND gates and supplies the original data signal to an input terminal of the output OR gate, if skew adjustment processing is disabled.

7. The skew adjustment apparatus according to claim 1, comprising a PLL circuit that generates an internal clock signal synchronized in phase with the clock signal superimposed on the delayed data signal output from the data selection unit.

* * * * *